(12) United States Patent
Sawada

(10) Patent No.: US 7,221,077 B2
(45) Date of Patent: May 22, 2007

(54) ULTRASONIC TRANSDUCER AND MANUFACTURING METHOD THEREOF

(75) Inventor: Yukihiko Sawada, Tokorozawa (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 11/242,414

(22) Filed: Oct. 3, 2005

(65) Prior Publication Data

US 2006/0071580 A1 Apr. 6, 2006

Related U.S. Application Data

(63) Continuation of application No. PCT/JP2004/004777, filed on Apr. 1, 2004.

(30) Foreign Application Priority Data

Apr. 1, 2003 (JP) ............................. 2003-098216
Apr. 1, 2003 (JP) ............................. 2003-098217

(51) Int. Cl.
H01L 41/083 (2006.01)
(52) U.S. Cl. ...................... 310/369; 310/322; 310/334
(58) Field of Classification Search ................ 310/369, 310/334, 335, 322, 326, 327
See application file for complete search history.

(56) References Cited

U.S. PATENT DOCUMENTS

| | | | |
|---|---|---|---|
| 4,701,659 A * | 10/1987 | Fujii et al. ................... 310/334 |
| 5,027,822 A | 7/1991 | Gelly et al. | |
| 5,042,493 A * | 8/1991 | Saito et al. .................. 600/459 |
| 5,410,208 A * | 4/1995 | Walters et al. .............. 310/334 |
| 5,423,220 A | 6/1995 | Finsterwald et al. | |
| 5,456,259 A | 10/1995 | Barlow et al. | |
| 5,640,370 A * | 6/1997 | Hanafy et al. .............. 367/140 |
| 5,857,974 A | 1/1999 | Eberle et al. | |
| 6,238,481 B1 * | 5/2001 | Yamashita et al. ............ 117/84 |

FOREIGN PATENT DOCUMENTS

| | | |
|---|---|---|
| EP | 0 853 919 A2 | 7/1998 |
| JP | 4-19858 | 3/1992 |
| JP | 2502685 | 3/1996 |
| JP | 10-192281 | 7/1998 |
| JP | 2002-27594 | 1/2000 |
| JP | 3248924 | 11/2001 |
| JP | 2002-84597 | 3/2002 |
| JP | 3344422 | 8/2002 |
| WO | WO 93/02809 | 2/1993 |
| WO | WO 94/16826 | 8/1994 |

* cited by examiner

Primary Examiner—Darren Schuberg
Assistant Examiner—Derek Rosenau
(74) Attorney, Agent, or Firm—Scully, Scott, Murphy and Presser, P.C.

(57) ABSTRACT

An ultrasonic transducer includes a piezoelectric member that includes electrodes on two plane portions. The electrodes are fixed and disposed such that part of an acoustic matching layer protrudes at a predetermined position of the hard layer, which makes up the acoustic matching layer. The piezoelectric member further includes a substrate formed with an electroconductive pattern and is fixed and disposed on the face of the hard layer. The piezoelectric member and the substrate are divided to array piezoelectric devices. The electroconductive pattern of the substrate, and at least part of the electrodes of the piezoelectric member that is electrically connected to at least part of this electro conductive pattern are directed in the same direction. The substrate is disposed adjacent to the piezoelectric member, the electroconductive pattern on the substrate, and the electrodes of the piezoelectric member. The electrodes are divided, and are electrically connected via an electroconductive member.

14 Claims, 11 Drawing Sheets

ULTRASONIC TRANSDUCER AND MANUFACTURING METHOD THEREOF

CROSS REFERENCE TO RELATED APPLICATION

This application is a continuation application of PCT/JP2004/004777 filed on Apr. 1, 2004 and claims the benefit of Japanese Applications No. 2003-098216 filed in Japan on Apr. 1, 2003 and No. 2003-098217 filed in Japan on Apr. 1, 2003, the entire contents of each of which are incorporated herein by their reference.

BACKGROUND OF THE INVENTION

1. Field of the Invention

The present invention relates to an ultrasonic transducer employed for an ultrasonic diagnostic apparatus and so forth.

2. Description of the Related Art

In the medical field, various types of ultrasonic diagnostic apparatuses have been proposed in conventional art wherein information regarding living body tissue is obtained by transmitting an ultrasonic wave toward the living body tissue from an ultrasonic transducer, and also receiving a reflected wave reflected by the living body tissue with the same ultrasonic transducer as the ultrasonic transducer which transmitted the ultrasonic wave, or another ultrasonic transducer provided in another member to perform signal processing for making an image.

Examples of ultrasonic transducers employed for such an ultrasonic diagnostic apparatus and so forth include an ultrasonic transducer employing the electronic scanning method wherein a plurality of piezoelectric devices are arrayed regularly. With this ultrasonic transducer, many piezoelectric devices are disposed in a row, and each of the piezoelectric devices is electrically connected with a signal wire extending from an ultrasonic observation apparatus. Electrical connection between the piezoelectric device and the signal wire is performed through a wiring substrate or lead wire.

For example, with the array ultrasonic probe disclosed in Japanese Examined Patent Application Publication No. 4-19858, a flexible substrate on which a plurality of substrate electrodes are printed so as to be arrayed with generally the same interval as the array interval of piezoelectric transducers is employed, and the substrate electrodes of this flexible substrate and each of the piezoelectric transducers are electrically connected by adhesion.

Also, with the method for manufacturing an ultrasonic probe disclosed in Japanese Patent No. 2502685, flexible electrical terminals and a flexible substrate on a curved member are connected one on one for each channel using a wire such as a gold wire or the like by means of wire bonding or the like.

Further, with Japanese Patent No. 3248924, the method for manufacturing an ultrasonic probe having excellent ultrasonic transducer properties is disclosed wherein a signal electrode and a lead wire are electrically connected, and incised to form each piezoelectric device while maintaining a piezoelectric material and a flexible printed circuit substrate in a parallel or generally parallel state.

SUMMARY OF THE INVENTION

An ultrasonic transducer according to the present invention comprises: an acoustic matching layer including at least a layer made up of a hard material; a piezoelectric member which is provided with electrodes on both plane portions and which is fixed and disposed such that part of the acoustic matching layer protrudes at a predetermined position of the layer made up of a hard material which makes up the acoustic matching layer; and a substrate of which at least one face side is formed with an electroconductive pattern and which is fixed and disposed on the face of the layer made up of a hard material; wherein with such a disposed state, the piezoelectric member and the substrate are divided into substrates on which a plurality of piezoelectric devices and a predetermined electroconductive pattern are disposed to array the plurality of piezoelectric devices; and wherein the electroconductive pattern of the substrate, and at least part of the electrodes of the piezoelectric member which is electrically connected to at least part of this electroconductive pattern are directed in the same direction, this substrate is disposed adjacent to the piezoelectric member, and the electroconductive pattern on the substrate and the electrodes of the piezoelectric member, which are divided, are electrically connected via an electroconductive member respectively. A method for manufacturing an ultrasonic transducer according to the present invention comprises: a process for providing a ground electrode on at least an acoustic matching layer made up of a hard material; a process for forming a first layered member by fixing a predetermined shaped piezoelectric member having electrodes to the acoustic matching layer from the hard material; a process for forming a second layered member by adjacently fixing the predetermined shaped substrate having a plurality of electroconductive patterns formed in a predetermined interval on the acoustic matching layer face made up of a hard material to the piezoelectric member; a process for providing an electroconductive member for electrically connecting the electrodes of the piezoelectric member and the electroconductive patterns of the substrate in an integral manner; and a process for forming dividing grooves having a predetermined interval and a predetermined depth dimension which are formed on the piezoelectric member and the substrate which are electrically connected via the electroconductive member. Accordingly, electrical connection between the electrode of the piezoelectric member and the corresponding electroconductive pattern of the substrate can be readily performed, thereby enabling reduction in size of the ultrasonic transducer, and also realizing improvement of workability and cost reduction. Also, in the event that malfunction occurs at the electrical connecting portion between the electrode of the piezoelectric member and the electroconductive pattern of the substrate, recovery can be readily performed, and also improvement of yield can be realized.

DESCRIPTION OF THE PREFERRED EMBODIMENT(S)

The present invention will be described in more detail with reference to the appended drawings.

Figure 1:
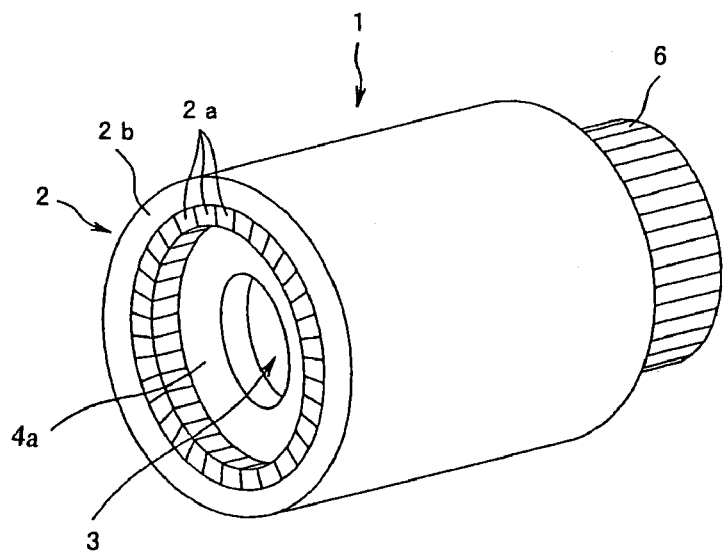
FIG. 1 is a perspective view illustrating an ultrasonic transducer.

As shown in FIG. 1, an ultrasonic transducer 1 according to the present embodiment is configured as a radial array type. The ultrasonic transducer 1 comprises an acoustic matching layer 2, a backing member 3, a first transducer shape-formative member 4a formed in a cylindrical shape, a second transducer shape-formative member (hereafter, abbreviated as shape-formative member) 4b, and a piezoelectric device 5. The acoustic matching layer 2 is formed by layering a first acoustic matching layer 2a made up of a hard material, and a second acoustic matching layer 2b made up of a soft material. Here, the term "hard" means a degree of hardness wherein a shape formed beforehand can be maintained. On the other hand, the term "soft" means to have flexibility regarding deformation and so forth.

Figure 3:
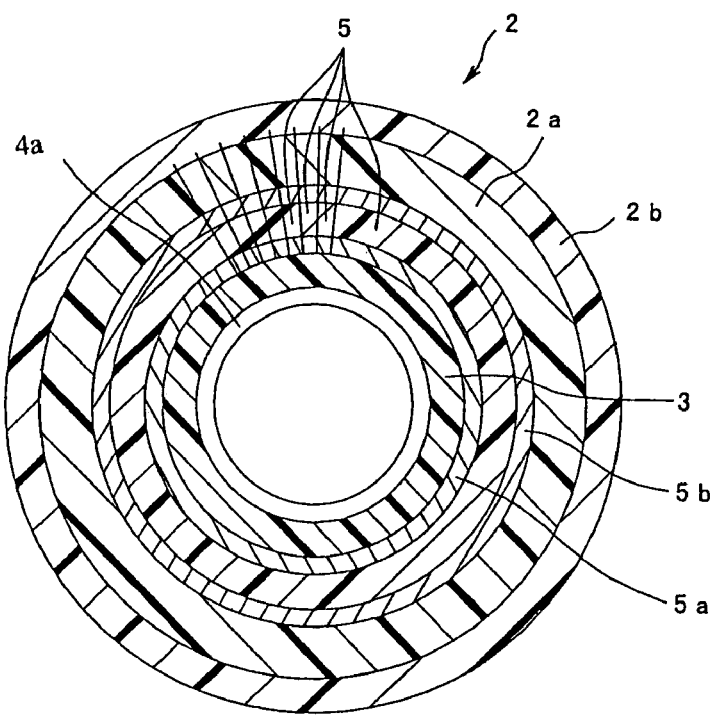
FIG. 3 is a cross-sectional view taken along line A—A in FIG. 2A.
Figure 2A:
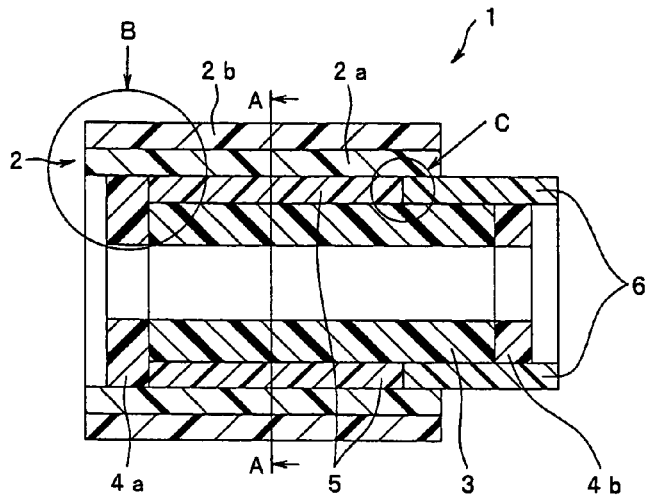
FIG. 2A is a cross-sectional view in the longitudinal direction for describing the configuration of the ultrasonic transducer.

As shown in FIG. 2A and FIG. 3, the backing member 3, the piezoelectric device 5, the first acoustic matching layer 2a, and the second acoustic matching layer 2b are disposed in order from the center of the cylindrical shape of the ultrasonic transducer 1 toward the outer circumferential side. The first shape-formative member 4a is disposed so as to be adjacent to one end sides of the backing member 3 and the piezoelectric device 5 in the inner direction of the first acoustic matching layer 2a making up the acoustic matching layer 2. A substrate 6 is disposed on the other end side of the piezoelectric device 5.

Note that the substrate 6 is also formed in a cylindrical shape by simulating the shape of the ultrasonic transducer 1 and the like. As for the substrate 6, a three-dimensional substrate, an alumina substrate, a glass epoxy substrate, a rigid flexible substrate, a flexible substrate, or the like is employed.

The second shape-formative member 4b is disposed so as to be adjacent to the other end side of the backing member 3 in the inner circumferential side of the substrate 6. Also, the acoustic matching layer 2 is disposed on one end side serving as a side wherein the first shape-formative member 4a of the ultrasonic transducer 1 is disposed, so as to protrude in the longitudinal axial direction as compared with the piezoelectric device 5.

The acoustic matching layer 2 is made up of the first acoustic matching layer 2a and the second acoustic matching layer 2b as described above, but as for a material of the first acoustic matching layer 2a, for example, a material obtained by mixing a resin member such as epoxy, silicone, polyimide, or the like with a powder member or fiber such as metal, ceramic, glass, or the like, or glass, machinable ceramics, silicon, or the like is employed. On the other hand, as for a material of the second acoustic matching layer 2b, for example, a resin member such as silicone, epoxy, PEEK, polyimide, polyetherimide, polysulfone, polyethersulfone, fluororesin, or the like, or rubber or the like is employed.

As shown in FIG. 1 and FIG. 3, the first acoustic matching layer 2a and the piezoelectric device 5 are divided into a predetermined number, e.g., 192, and arrayed.

As for the backing member 3, a member obtained by hardening an epoxy resin including alumina powder is employed, for example. Note that as the backing member 3, a resin member such as epoxy, silicon, polyimide, polyetherimide, PEEK, urethane, fluorine, or the like, a rubber member such as chloroprene rubber, propylene rubber, butadiene rubber, urethane rubber, silicone rubber, fluororubber, or the like, or a member obtained by mixing such a resin member or rubber member with metal such as tungsten, ceramics such as alumina, zirconia, silica, tungstic oxide, piezoelectric ceramics powder, ferrite, or the like, or a powder member or fiber such as glass or resin or the like, or a single or plurality of fillers in material or a shape made up of hollow particles, or the like, may be employed.

The piezoelectric device 5 is formed by cutting a piezoelectric ceramic such as lead zirconate titanate, lead titanate, barium titanate, BNT-BS-ST, or the like, or piezoelectric crystal or relaxor ferroelectric such as LiNbO3 or PZNT or the like, which is formed in a plate shape. A one-face side electrode 5a and an other-face side electrode 5b are obtained by providing an electroconductive member such as gold, silver, copper, nickel chrome, or the like on the surface of the plate-shaped piezoelectric ceramic beforehand as a single layer, multi layer, or alloy layer by sintering or by a thin film or plating such as vapor deposition, sputtering, ion plating, or the like.

Now, description will be made regarding an electroconductive system in the ultrasonic transducer 1 based on FIG. 2B through FIG. 2D serving as partially enlarged views of the range B in FIG. 2A, and FIG. 2E serving as a partially enlarged view of the range C.

Figures 2B, 2C:
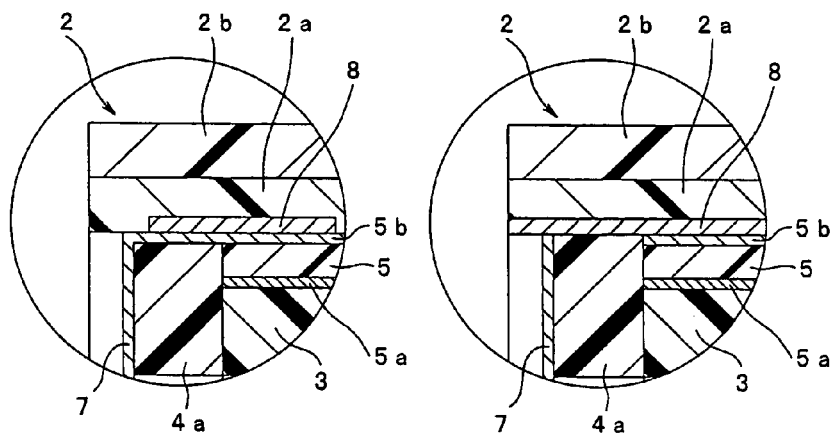
FIG. 2B is an enlarged view of the portion shown with the arrow B in FIG. 2A.
FIG. 2C is a diagram for describing another configuration example of the portion shown with the arrow B in FIG. 2A.

As shown in FIG. 2B, the inner circumferential side of the piezoelectric device 5 is provided with the one-face side electrode 5a, and the outer circumferential side thereof is provided with the other-face side electrode 5b. On the inner circumferential side of the first acoustic matching layer 2a making up the acoustic matching layer 2, a ground electrode 8 is disposed and formed along generally the entire circumference. The ground electrode 8 is in contact with the electrode 5b provided on the outer circumference of the piezoelectric device 5 and with an electroconductive portion 7 provided on the outer circumference of the first shape-formative member 4a.

Note that description will be made later regarding placement of the ground electrode 8 as well as description regarding the manufacturing method.

The first shape-formative member 4a is bonded and fixed to the inner circumferential face of the first acoustic matching layer 2a with an electroconductive member, e.g., an electroconductive adhesive agent (not shown). Thus, the electroconductive portion 7 and the ground electrode 8 become an electroconductive state. Note that the electroconductive member is not restricted to an electroconductive adhesive agent, a brazing metal member such as solder, brazing silver, brazing gold, or the like, or an electroconductive film or the like may be employed.

Thus, the other-face side electrode 5b, the electroconductive portion 7, and the ground electrode 8 are electrically connected.

In FIG. 2B, the other-face side electrode 5b and the electroconductive portion 7 are integrally formed, but the other-face side electrode 5b, the electroconductive portion 7, and the ground electrode 8 should be connected so as to be electrically equal. For example, as shown in FIG. 2C, the ground electrode 8 may be consecutively provided up to one end side of the acoustic matching layer 2.

Figures 2D, 2E:
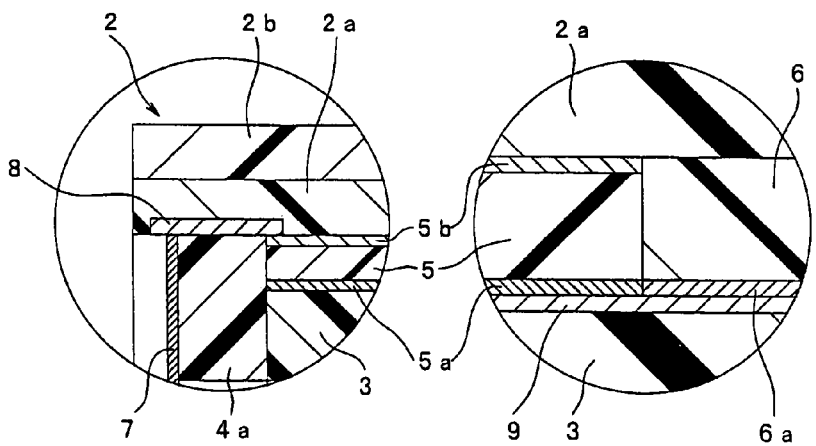
FIG. 2D is a diagram for describing another configuration example of the portion shown with the arrow B in FIG. 2A.
FIG. 2E is an enlarged view of the portion shown in the arrow C in FIG. 2A.

Also, as shown in FIG. 2D, an arrangement may be made wherein the ground electrode 8 may be made a little larger than the thickness of the first shape-formative member 4a serving as the length of the longitudinal axial direction thereof such that only a part of around the longitudinal direction thereof is in contact with the other-face side electrode 5b and the electroconductive portion 7. In this case, let us say that the ground electrode 8 is configured so as to be exposed to the outside, and between the electroconductive portion 4a and the ground electrode 8 is in an electroconductive state with an electroconductive member such as an electroconductive resin, electroconductive painting, or the like, or an electroconductive film such as various types of electroconductive thin film, electroconductive thick film, plating, or the like. Also, a combination of these materials may be employed.

As shown in FIG. 2E, in the vicinity of a portion where the piezoelectric device 5 and the substrate 6 are adjacently disposed, an electroconductive member 9 is disposed in the inner circumferential side of the backing member 3 so as to electrically connect the electroconductive pattern 6a provided in the inner circumferential side of the substrate 6, and the one-face side electrode 5a.

A method for manufacturing the ultrasonic transducer 1 configured as described above will be described with reference to FIG. 4A through FIG. 10C.

The method for manufacturing the ultrasonic transducer 1 comprises the following processes.

(1) Process for forming the acoustic matching layer 2

Figure 4A:
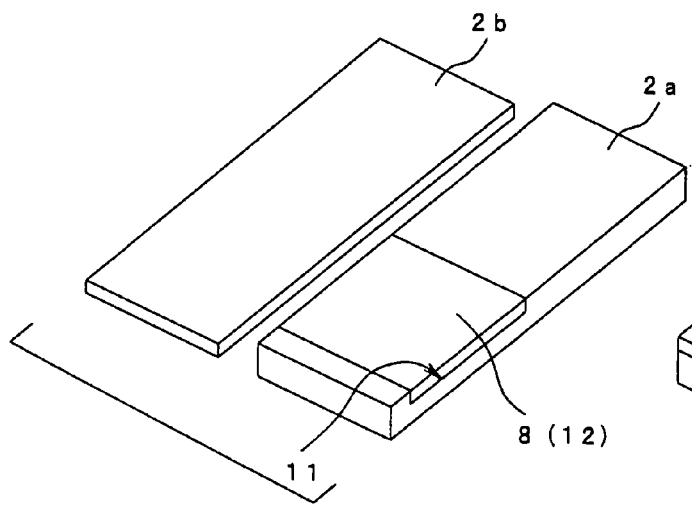
FIG. 4A is a diagram for describing members making up an acoustic matching layer.

In order to form the acoustic matching layer 2, first, the first acoustic matching layer 2a and the second acoustic matching layer 2b, which have predetermined dimensions and a predetermined shape as shown in FIG. 4A, and also are adjusted to a predetermined acoustic impedance value, are prepared. Subsequently, the ground electrode 8 in a plate shape is disposed at a predetermined position on one face side of the first acoustic matching layer 2a.

Figure 4B:
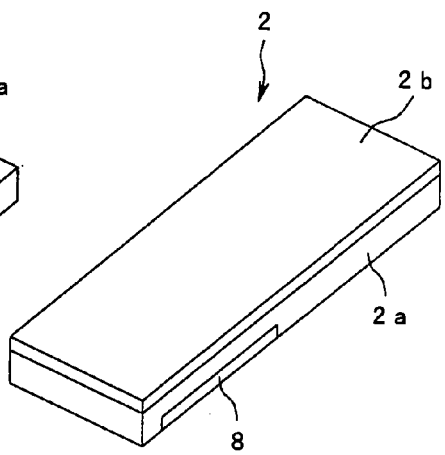
FIG. 4B is a diagram for describing the acoustic matching layer.

Next, as shown in FIG. 4B, the acoustic matching layer 2 is formed by integrally layering the first acoustic matching layer 2a and the second acoustic matching layer 2b. At this time, the second acoustic matching layer 2b is disposed on the other face side of the first acoustic matching layer 2a on which the ground electrode 8 is not provided. The acoustic matching layer 2 may be integrated following each of the first acoustic matching layer 2a and the second acoustic matching 2b being formed in a predetermined thickness, or may be formed in a predetermined thickness following integration, or may be directly formed by applying or casting or film-forming one to the other without bonding, or may be formed by a combination of these.

Note that as for the ground electrode 8, an electroconductive member 12 in a plate shape formed with a predetermined width dimension and thickness dimension may be bonded and disposed in a groove 11 formed with a predetermined width dimension and depth dimension at a predetermined position of the first acoustic matching layer 2a. Also, as for the ground electrode 8, a plate-shaped electroconductive member formed with a predetermined width dimension and thicker dimension than the above depth dimension may be bonded and disposed in the groove 11. Also, as for the ground electrode 8, following an unshown electroconductive resin or the like being applied or filled so as to be protruded, the protruding portion of this electroconductive member may be worked and formed such that the face thereof matches the face of the first acoustic matching layer 2a. Also, as for the ground electrode 8, following an electroconductive member being bonded, applied, or filled in the groove 11 of the first acoustic matching layer 2a formed with thicker dimension than a predetermined thickness dimension, the entirety may be worked and formed so as to become a predetermined thickness dimension. Also, the ground electrode 8 may be formed by various types of conductive film.

As for the ground electrode 8, a conductive material such as an electroconductive resin, electroconductive painting, metal, or the like, or a conductive film such as various types of conductive thin film, conductive thick film, plating, or the like is employed.

(2) Process for forming the first layered member

A first layered member 21 is formed from the acoustic matching layer 2 formed in the first process, and a piezoelectric ceramic 13 wherein the one-face side electrode 5a and the other-face side electrode 5b are provided on both faces of a piezoelectric device. With the piezoelectric ceramic 13, the length dimension is formed shorter than the length dimension of the acoustic matching layer 2 by a predetermined dimension, the width dimension is formed with generally the same dimension, and the thickness dimension is formed with a predetermined dimension.

Figure 5A:
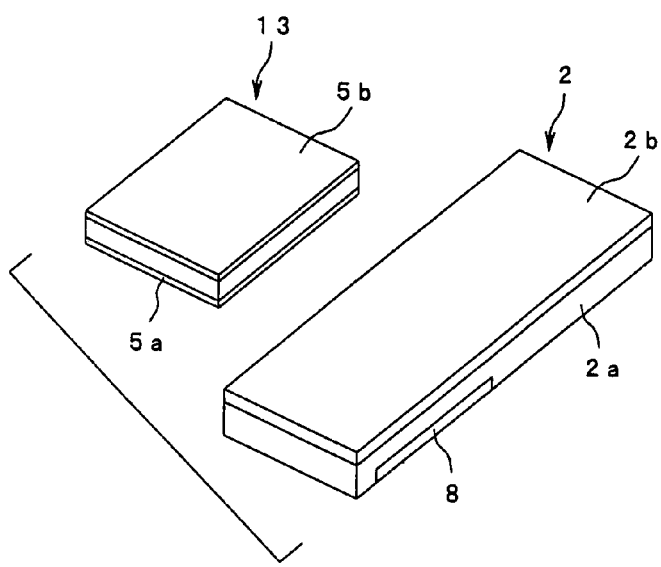
FIG. 5A is a diagram for describing members making up a first layered member.

Specifically, first, the acoustic matching layer 2 and the piezoelectric ceramic 13 are prepared as shown in FIG. 5A.

Figure 5B:
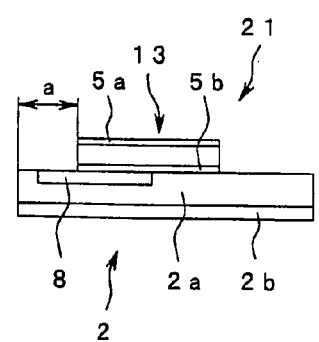
FIG. 5B is a diagram for describing the first layered member.

Next, as shown in FIG. 5B, the other-face side electrode 5b of the piezoelectric ceramic 13 is bonded and fixed at a position shifted by, for example, a distance a serving as a predetermined amount from one side of the generally rectangular acoustic matching layer 2 on the surface of the acoustic matching layer 2 on which the ground electrode 8 is formed such that at least part thereof is in contact with the ground electrode 8.

Thus, the integral first layered member 21 is formed in an electroconductive state between the other-face side electrode 5b and the ground electrode 8 of the piezoelectric ceramic 13. At this time, one end face side of the acoustic matching layer 2 on which the ground electrode 8 is disposed becomes a protruding state from one end face side of the piezoelectric ceramic 13 by the distance a.

(3) Process for Forming a Second Layered Member

A second layered member 22 is formed from the first layered member 21 formed in the above process, and electroconductive patterns 6a.

Figure 6A:
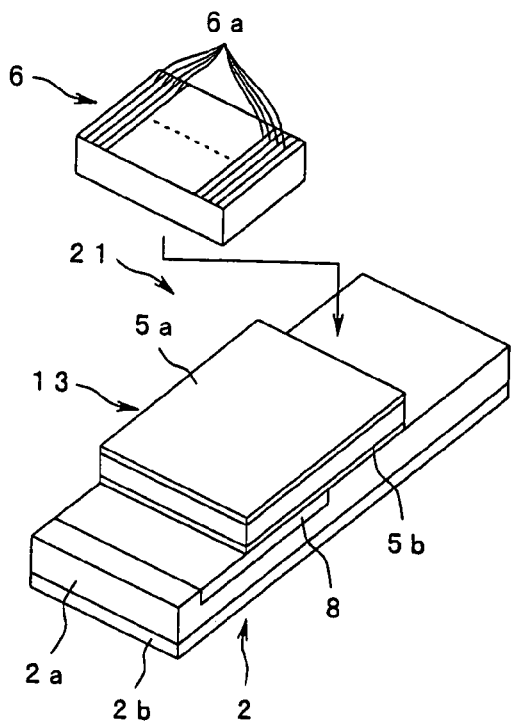
FIG. 6A is a diagram for describing members making up a second layered member.

First, as shown in FIG. 6A, the first layered member 21 formed in the second process and the substrate 6 of which one face sides are regularly arrayed with a plurality of electroconductive patterns 6a, . . . , 6a in a predetermined interval, are prepared. The thickness dimension of this substrate is generally the same as the thickness dimension of the piezoelectric ceramic 13.

Figure 6B:
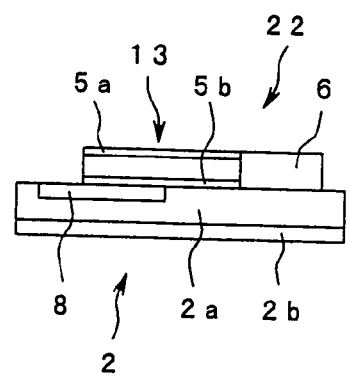
FIG. 6B is a diagram for describing the second layered member.

Next, as shown in FIG. 6B, the substrate 6 is disposed in a state wherein the electroconductive patterns 6a, . . . , 6a are turned upward so as to be adjacent to the piezoelectric ceramic 13, and bonded and fixed as to the first acoustic matching layer 2a.

Thus, the second layered member 22 is formed wherein the piezoelectric ceramic 13 and the substrate 6 are adjacently disposed on the face of the first acoustic matching layer 2a. Note that the width dimension and length dimension of the substrate 6 are set to be predetermined dimensions.

(4) Process for Electrically Connecting the Electroconductive Patterns 6a, . . . , 6a of the Substrate and the One-Face Side Electrode 5a of the Piezoelectric Ceramic 13

Figure 7:
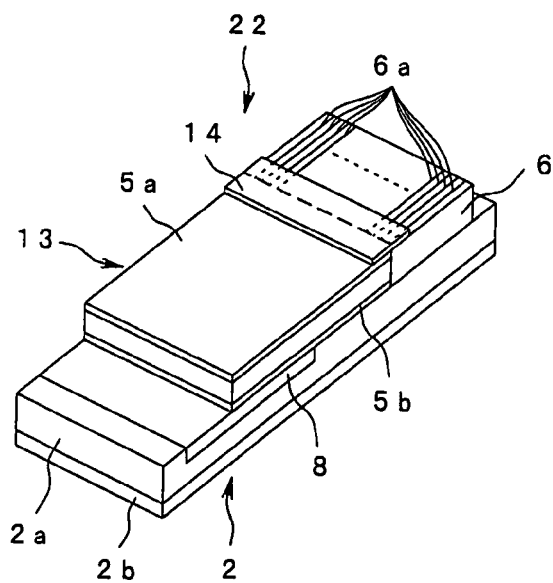
FIG. 7 is a diagram for describing a process for electrically connecting an electroconductive pattern of a substrate and a one-face side electrode of a piezoelectric ceramic.

As shown in FIG. 7, an electroconductive film portion 14 is provided by disposing an unshown mask member at a predetermined position on the surface of the piezoelectric ceramic 13 on which the one-face-side electrode 5a is provided, and the substrate 6 on which the electroconductive patterns 6a of the second layered member 22 are formed, applying electroconductive painting or an electroconductive adhesive agent or the like serving as a film member thereupon, or accreting metal such as gold, silver, chrome, indium dioxide, or the like, or a conductive member by means of vapor deposition, sputtering, ion plating, CVD, or the like.

The electroconductive film portion 14 is thus formed, thereby electrically connecting the electroconductive patterns 6a, . . . , 6a and the one-face side electrode 5a.

(5) Process for Dividing the Piezoelectric Ceramic 13 Into a Plurality of Piezoelectric Devices 5, . . . , 5

Figure 8A:
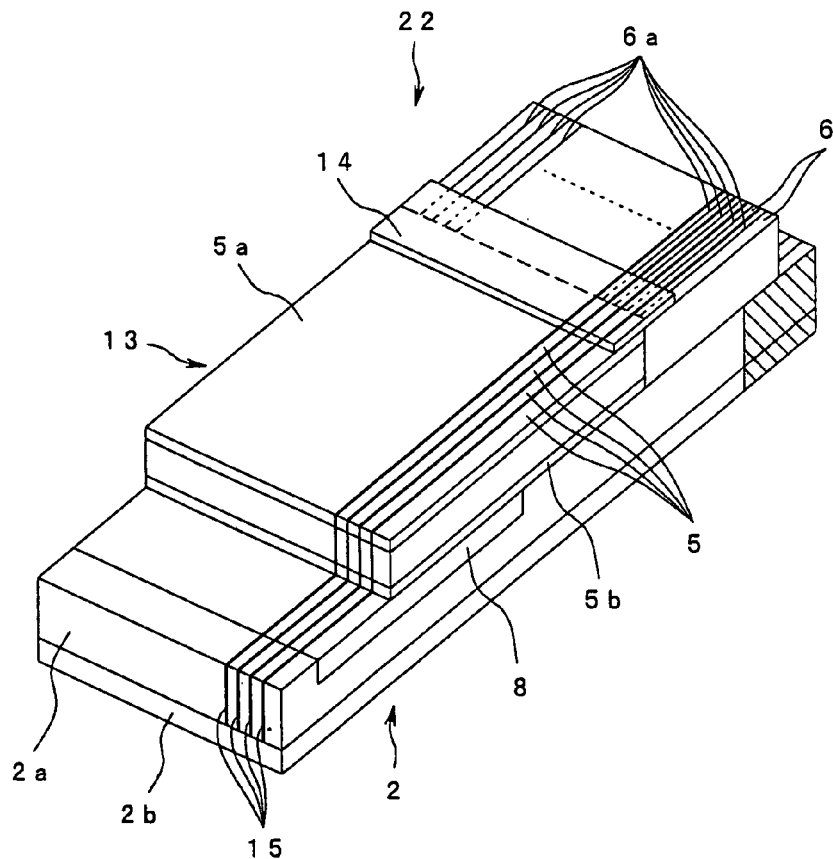
FIG. 8A is a diagram illustrating a state wherein dividing grooves are formed, and the piezoelectric ceramic is divided into piezoelectric devices.

As shown in FIG. 8A, dividing grooves 15 having a predetermined depth dimension, and a predetermined width dimension or a predetermined shape which passes through the first acoustic matching layer 2a making up the acoustic matching layer 2 from the surface side of the piezoelectric ceramic 13 and the substrate 6, and reaches part of the second acoustic matching layer 2b are formed with a predetermined pitch in the direction orthogonal to the longitudinal direction. Note that the dividing grooves 15 are formed using cutting means such as an unshown dicing saw or laser apparatus, or the like. At this time, the cutting means are disposed on the center line, which divides the two electroconductive patterns 6a and 6a.

With this process, the substrate 6 on which the plurality of electroconductive patterns 6a, . . . , 6a are provided is divided into a plurality of substrates 6, . . . , 6 on which at least the single electroconductive pattern 6a is disposed, and also the piezoelectric ceramic 13 is divided into a plurality of piezoelectric ceramics 13. At this time, the electroconductive film portion 14 is divided into a plurality of electroconductive members 9. Thus, a plurality of piezoelectric devices 5, . . . , 5 which electrically connect the respective electroconductive patterns 6a with the electroconductive members 9 are arrayed on the single acoustic matching layer 2.

Figure 8B:
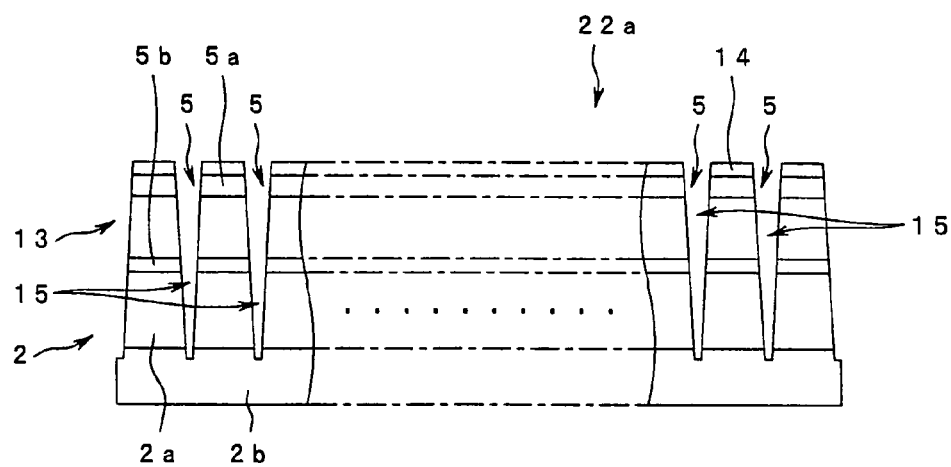
FIG. 8B is a side view of the second layered member having dividing grooves formed in a cutting process as viewed from the cutting direction.

As shown in FIG. 8B, a predetermined number of dividing grooves 15 are formed with a predetermined pitch in the second layered member 22. Thus, the piezoelectric ceramic 13, the substrate 6, the electroconductive film portion 14, and the first acoustic matching layer 2a are divided into a predetermined number, the second layered member 22 made up of the piezoelectric ceramic 13 and the substrate 6 becomes a second layered member 22a made up of a group of layered members on which the plurality of piezoelectric devices 5, . . . , 5 and the plurality of substrates 6, . . . , 6 are disposed. In other words, it can be said that the second layered member 22 becomes a state wherein the plurality of piezoelectric devices 5, . . . , 5 are arrayed on the second acoustic matching layer 2b having flexibility making up the acoustic matching layer 2.

Figure 9:
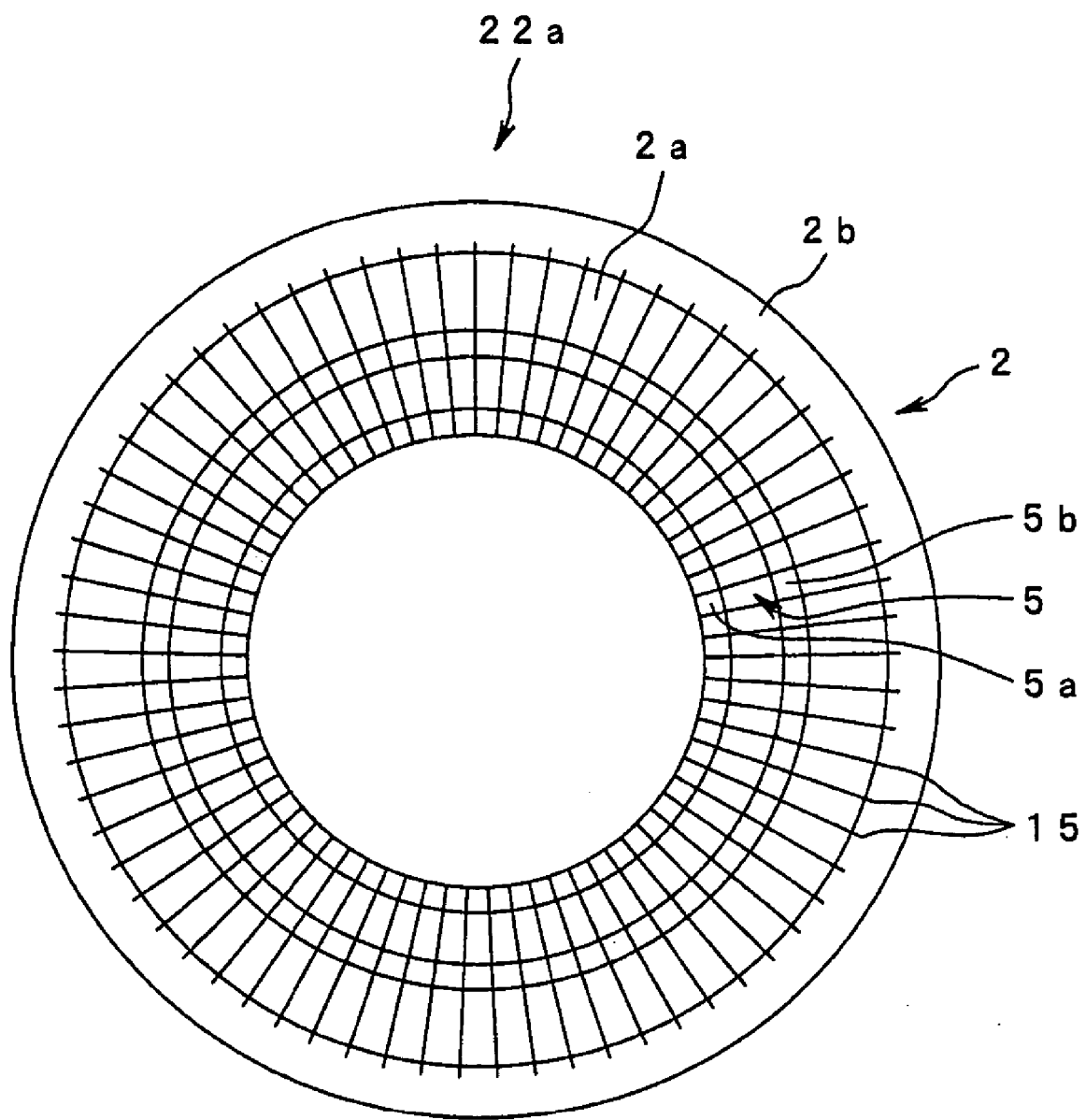
FIG. 9 is a diagram wherein the second layered member on which a plurality of piezoelectric devices are provided is deformed to a cylindrical shape.

Subsequently, the second layered member 22a is subjected to curved deformation such that the second acoustic matching layer 2b is disposed on the outermost circumferential side, and formed in a cylindrical shape as shown in FIG. 9.

Note that following the dividing grooves 15 being formed, the acoustic matching layer 2 shown with hatched lines in FIG. 8A for example is removed, which is unnecessary for forming the ultrasonic transducer 1. Also similarly, with regard to the respective members making up the second layered member 22, an arrangement may be made wherein the lengths thereof for example are employed greater than predetermined shapes, and consequently, unnecessary portions are removed. Further as necessary, an electroconductive check regarding whether or not the one-face side electrode 5a of the respective piezoelectric devices 5, . . . , 5 is electrically connected to the electroconductive pattern 6a of the respective substrates 6, . . . , 6 through the electroconductive member 9.

(6) Process for Forming a Cylindrical Transducer Unit (Hereafter, Abbreviated as Cylindrical Unit) 23

A cylindrical unit 23 is formed from the second layered member 22a formed in the above process, and the first and second shape-formative members 4a and 4b.

Figure 10A:
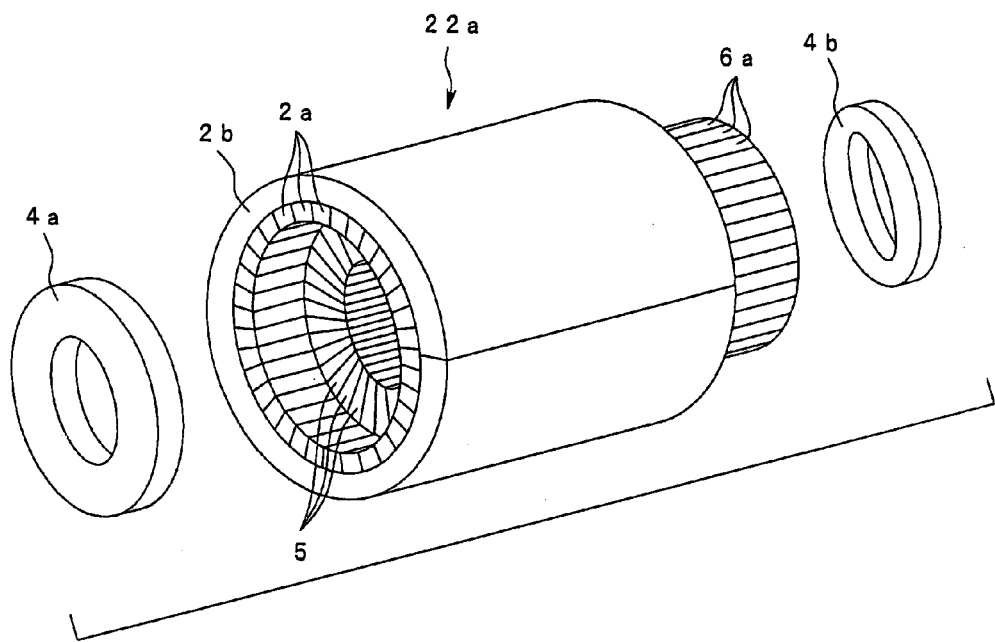
FIG. 10A is a diagram for describing members making up a cylindrical transducer unit.
Figure 10B:
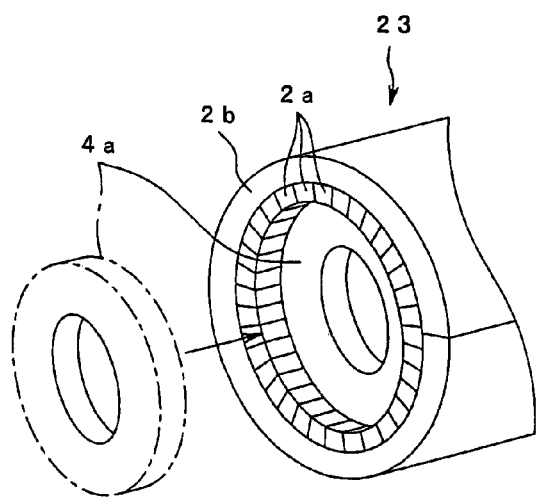
FIG. 10B is a diagram for describing a state wherein a shape-formative member is disposed in a first acoustic matching layer.
Figure 10C:
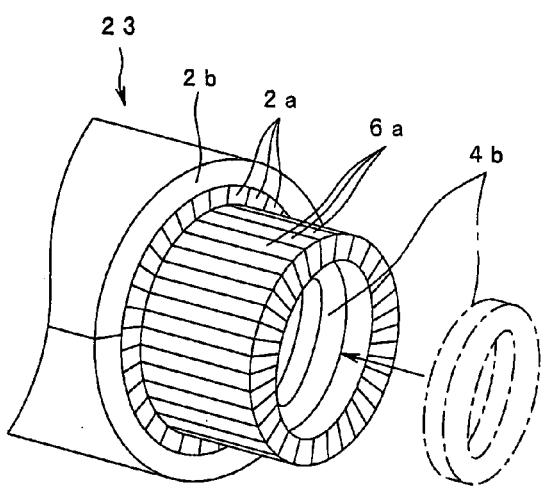
FIG. 10C is a diagram for describing a state wherein a shape-formative member is disposed in the substrate.

Specifically, following the second layered member 22a being formed in a cylindrical shape as shown in FIG. 10A, the first shape-formative member 4a is integrally bonded and fixed to the first acoustic matching layer 2a of the acoustic matching layer 2 with an electroconductive adhesive agent, as shown in FIG. 10B. Also, as shown in FIG. 10C, the second shape-formative member 4b is integrally bonded and fixed to the inner circumferential surface side of the substrates 6, . . . , 6 adjacent to the piezoelectric devices 5, . . . , 5 with a non-electroconductive adhesive agent.

Thus, the cylindrical unit 23 having a predetermined curvature is formed from the second layered member 22a by bonding and fixing the first acoustic matching layer 2a made up of a hard material, the first shape-formative member 4a and the substrate 6, and the second shape-formative member 4b. At this time, the ground electrode 8 in an electroconductive state as to the other-face side electrode 5b provided on the divided piezoelectric devices 5, . . . , 5, and the electroconductive portion 7 of the first shape-formative member 4a become an integrally electroconductive state.

The electroconductive portion 7 is connected with a ground wire extending from an unshown ultrasonic observation apparatus, thereby ensuring ground having sufficient capacity. Now, an arrangement may be made wherein the first shape-formative member 4a is bonded to the first acoustic matching layer 2a using a non-electroconductive adhesive agent, following which may be electrically connected by means of a conductive thin film, an electroconductive resin, a conductive thick film, or the like.

Thus, the other-face side electrode 5b provided on the respective piezoelectric devices 5, . . . , 5 is connected to the ground electrode 8 integrated by the electroconductive portion 7 so as to ensure ground having large capacity by providing the ground electrode 8 on the acoustic matching layer 2 beforehand, which becomes an electroconductive state as to a predetermined electrode and the electroconductive portion of a predetermined shape-formative member provided on the piezoelectric ceramic 13, and electrically connecting this ground electrode 8 and the predetermined electrode and the electroconductive portion 7 of the predetermined shape-formative member provided on the piezoelectric ceramic 13 at the time of an assembly process.

Figure 11A:
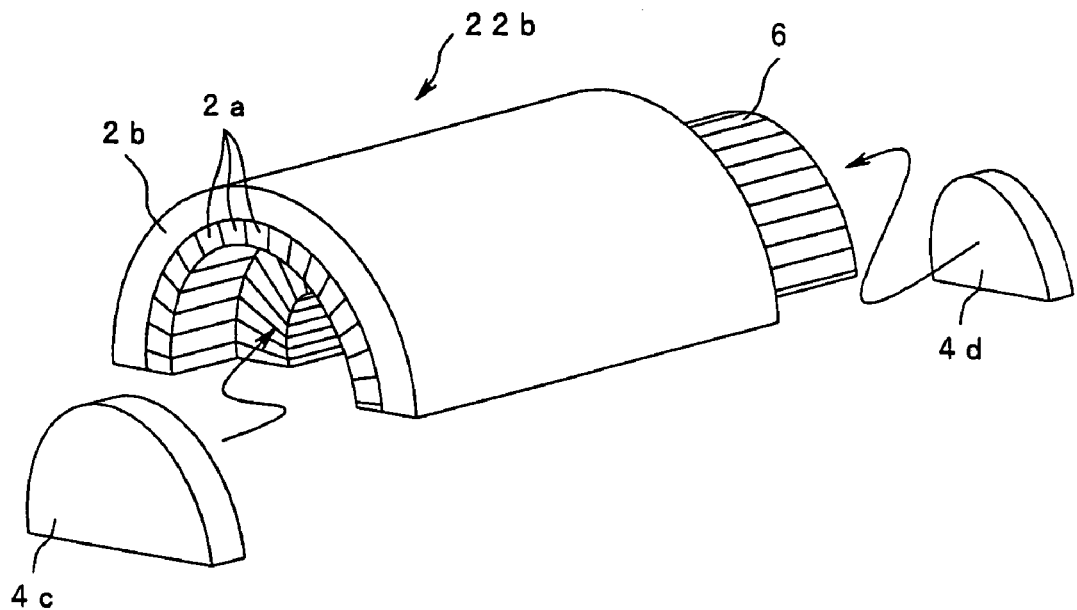
FIG. 11A is a diagram illustrating shape-formative members and a second layered member for forming a convex-array transducer unit.

Note that with the present embodiment, the process for forming the radial-array ultrasonic transducer 1 using the first shape-formative member 4a and the second shape-formative member 4b has been described, but instead of employing the shape-formative members 4a and 4b shown in the present process, a convex-array transducer unit may be formed by fixing a third shape-formative member 4c and a fourth shape-formative member 4d formed in a partially cylindrical shape for example as shown in FIG. 11A to the first acoustic matching layer 2a of the second layered member 22b having the piezoelectric devices 5, . . . , 5 which are divided into a predetermined number in a predetermined shape, as with the above description.

Figure 11B:
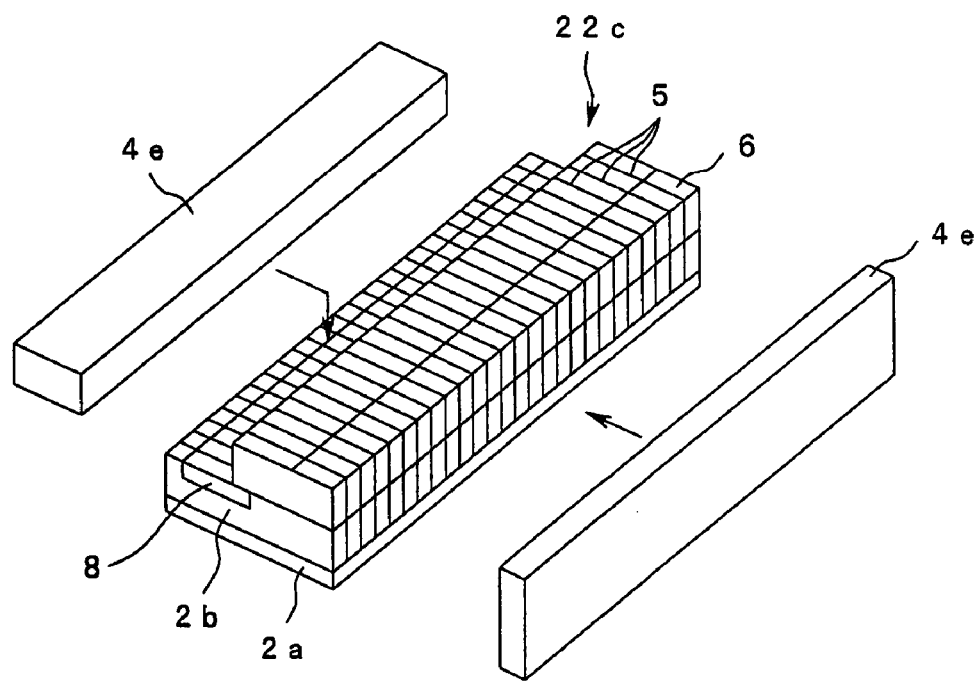
FIG. 11B is a diagram illustrating shape-formative members and a second layered member for forming a linear-array transducer unit.

Now, as shown in FIG. 11B, a linear-array transducer unit is formed by preparing a plate-shaped shape-formative member 4e of which the end portion is flat, and also fixing the shape-formative member 4e such that the flat portion is in contact with the first acoustic matching layer 2a of the second layered member 22c, as with the above process. Further, the end portion shape of the shape-formative member is not restricted to an arc or a straight line, and a combination of these and deformation may be employed, whereby a plurality of array can be disposed without restriction. Accordingly, the ultrasonic scanning direction may be set without restriction.

At this time, the ground electrode 8 and the electroconductive portion 7 of the shape-formative member 4a become an electroconductive state. Ground having sufficient capacity is ensured by connecting this electroconductive portion 7 with a ground wire extending from an unshown ultrasonic observation apparatus. Even in the event that the shape-formative member 4a is fixed with a non-electroconductive adhesive agent, following which may be electrically connected by means of a conductive thin film, an electroconductive resin, a conductive thick film, or the like, there is no problem at all. Further, the end portion shape of the shape-formative member 4a is not restricted to an arc or a straight line, and a combination of these and deformation may be employed, whereby a plurality of array can be disposed without restriction. Accordingly, the ultrasonic scanning direction may be set without restriction.

Also, of the second layered members 22a rejected by the above electroconductive check, in the event that there is malfunction in electrical connection between the one-face side electrode 5a and the electroconductive pattern 6a, recovery work for electrically connecting the one-face side electrode 5a of the piezoelectric device 5 and the electroconductive pattern 6a of the substrate 6, which is a defective portion, is performed as necessary.

Figure 12A:
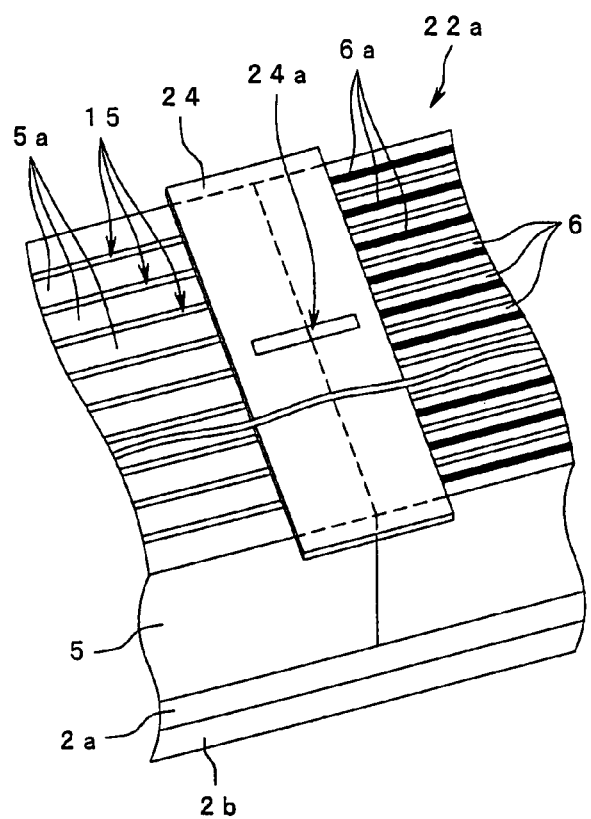
FIG. 12A is a diagram for describing a state wherein recovery of an electrical connection defective portion is performed using a mask member for recovery.

At this time, as shown in FIG. 12A, the second layered member 22a is disposed on a recovery tool (not shown), and an opening 24a of a mask member 24 for recovery is disposed at a position corresponding to the piezoelectric device 5 and the electroconductive pattern 6a of the substrate 6, which is a defective portion. Subsequently, recovery for providing a recovery conductive film portion for electrically connecting the one-face side electrode 5a of the piezoelectric device 5 and the electroconductive pattern 6a of the substrate 6 is performed by applying electroconductive painting or an electroconductive adhesive agent or the like on the defective portion.

Subsequently, an electroconductive check is performed again following recovery of the defective portion being completed, and in the event of passing this check, the second layered member 22a subjected to recovery is handed to a process for forming a cylindrical unit 23.

Figure 12B:
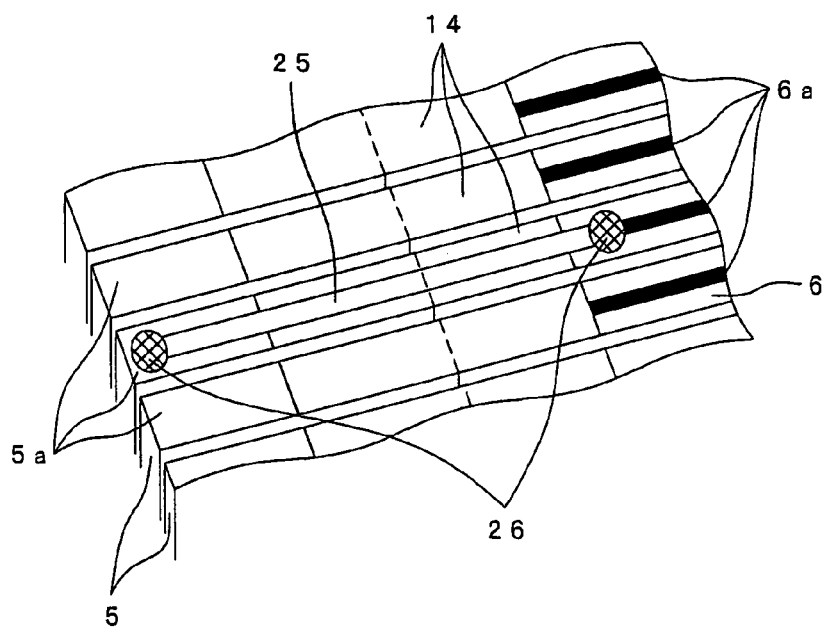
FIG. 12B is a diagram illustrating a state wherein recovery of an electrical connection defective portion is performed by providing a metal member and electroconductive adhesive portions.

Also, as shown in FIG. 12A, instead of electrically connecting the one-face side electrode 5a of the piezoelectric device 5 and the electroconductive pattern 6a of the substrate 6 by applying electroconductive painting thereupon, a metal member 25 is disposed above the one-face side electrode 5a and the electroconductive pattern 6a, which is a defective portion as shown in FIG. 12B, and this metal member 25 is fixed to the one-face side electrode 5a and the electroconductive pattern 6a by, for example, providing an electroconductive adhesive portion 26, performing ultrasonic bonding, or the like.

Thus, recovery work for electrically connecting the one-face side electrode 5a of the piezoelectric device 5 and the electroconductive pattern 6a of the substrate 6, which is a defective portion, can be performed.

Note that it is needless to say that these methods can be employed not only for recovery of a defective portion but also for electrical connection behavior itself between the piezoelectric device 5 and the electroconductive pattern 6a of the substrate 6.

(7) Process for Forming the Backing Member

A radial-array ultrasonic transducer having a configuration such as shown in FIG. 1 through FIG. 3 is formed by forming the backing member 3 using a rubber member including ferrite, epoxy including alumina powder, or the like on the one-face side electrode 5a side of the piezoelectric device 5 as a material by means of a method such as bonding, casting, or the like.

Figure 13:
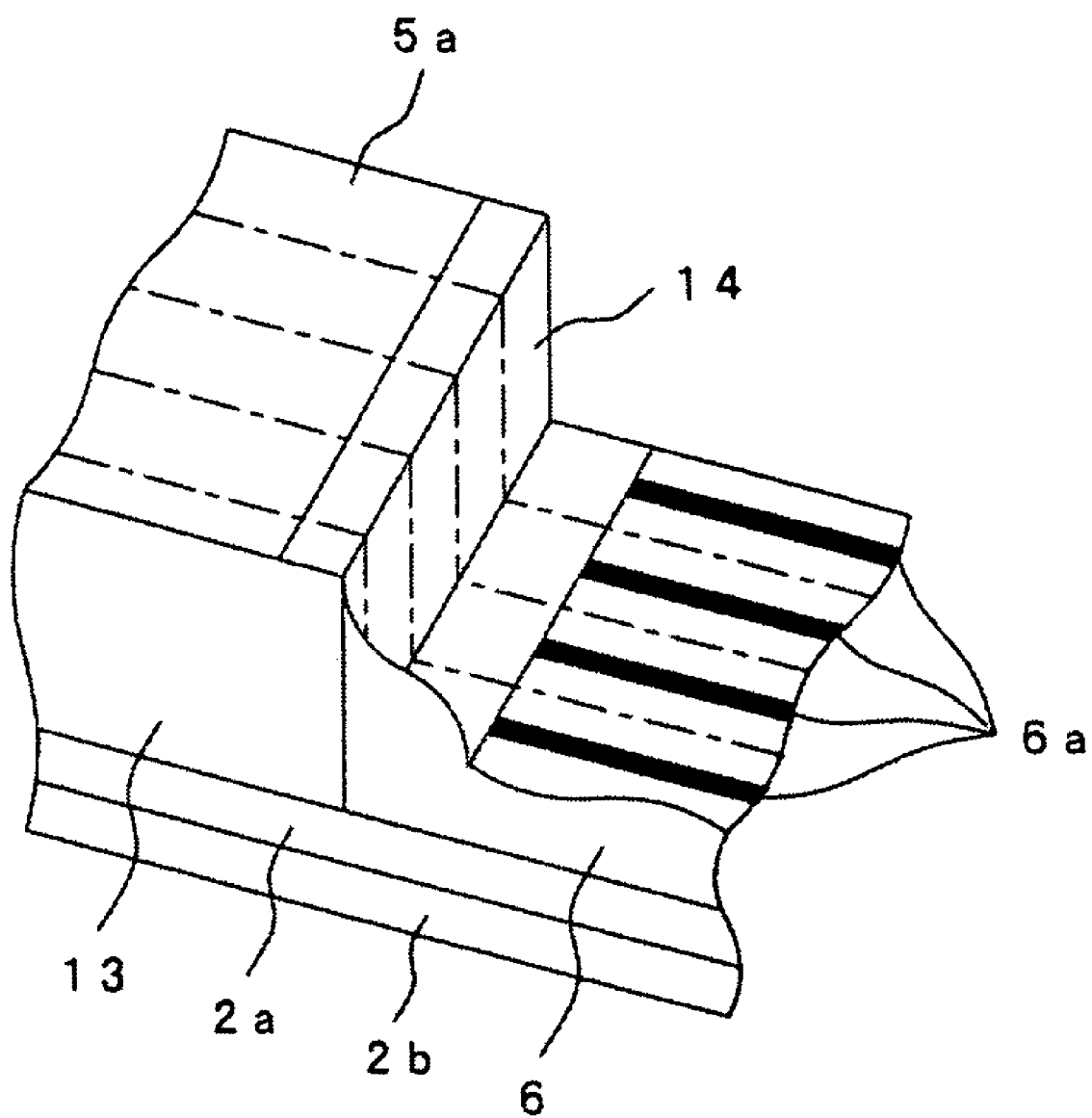
FIG. 13 is a diagram for describing electrical connection between a piezoelectric member and a substrate, which has a step.

Note that with the present embodiment, the thickness dimensions of the piezoelectric ceramic 13 and the substrate 6 are generally the same, but the thickness dimensions of the piezoelectric ceramic 13 and the substrate 6 are not restricted to generally the same. For example, as shown in FIG. 13, even in the event that the thickness dimensions of the piezoelectric ceramic 13 and the substrate 6 are different, following an electrical connecting portion made up of an electroconductive film portion 14 or the like which forms electrical connection between the one-face side electrode 5a of the piezoelectric device 5 and the electroconductive pattern 6a of the substrate 6 by means of the above thin film, electroconductive painting, an electroconductive adhesive agent, or the like being provided, the piezoelectric devices 5, . . . , 5 wherein the electroconductive pattern 6a is electrically connected on the acoustic matching layer 2 using the electroconductive member 9, are arrayed by performing dividing along chain lines.

Thus, the substrate is disposed adjacent to the piezoelectric member, and also the electroconductive pattern provided on the substrate, and the electrode of the piezoelectric member which is electrically connected to this electroconductive pattern are disposed in the same direction, whereby electrical connection between the electrode of the piezoelectric member and the corresponding electroconductive pattern of the substrate can be readily performed.

Also, regardless of difference between the thickness dimension of the piezoelectric member and the thickness dimension of the substrate, electrical connection between the electrode of the piezoelectric member and the corresponding electroconductive pattern of the substrate can be readily performed.

The above factors enable reduction in size of an ultrasonic transducer, and also enable improvement of workability and cost reduction to be realized. Also, in the event that there is malfunction at the electrical connecting portion between the electrode of the piezoelectric member and the electroconductive pattern of the substrate, recovery can be readily performed, and also improvement of yield can be realized.

Note that the present invention is not restricted to the above embodiment alone; rather, various modifications can be made without departing from the spirit and scope of the present invention. For example, with the present embodiment, the substrate 6 and the piezoelectric device 5 are disposed in parallel, and are electrically connected by the electroconductive member, but the present invention is not restricted to this, for example, the substrate may be positioned on the inside or the side face of the backing member, the frame and the substrate may be united, or the substrate and the piezoelectric device may be connected with a metal fine wire or the like.

Figure 14A:
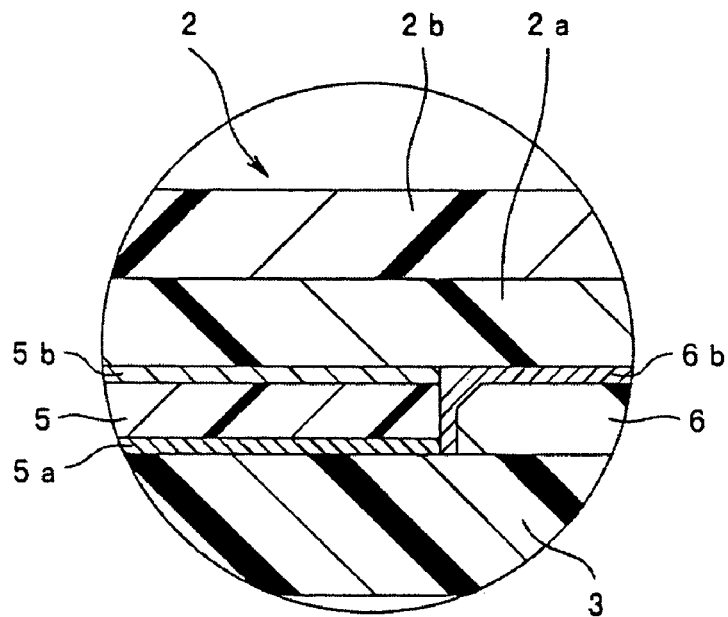
FIG. 14A is a diagram for describing a configuration example for realizing electrical insulation between an other-face side electrode and an electroconductive pattern.
Figure 14B:
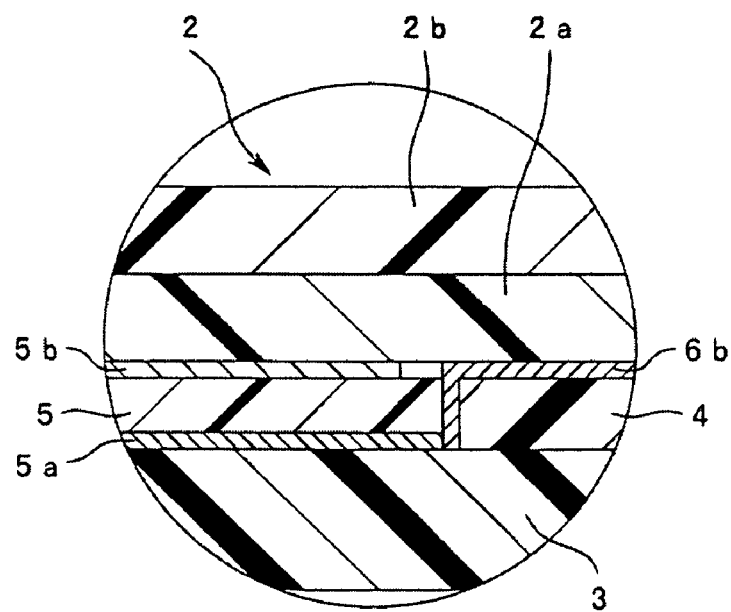
FIG. 14B is a diagram for describing another configuration example for realizing electrical insulation between an other-face side electrode and an electroconductive pattern.

Also, for example, as shown in FIG. 14A and FIG. 14B, an electroconductive pattern 6b is consecutively provided from one end surface to one principal surface of the substrate 6, whereby design can be configured so as to dispose an extraction terminal toward the outside of the array of this electroconductive pattern 6b in the outer circumference. Thus, an advantage wherein a degree of freedom regarding design is expanded can be obtained at the time of mounting the ultrasonic transducer upon a product. At this time, as shown in the drawings, the shape of the substrate 6 or the shape of the electrode 5b of the piezoelectric device 5 or the like is adjusted, and electrical insulation between the electroconductive pattern 6b and the electrode 5b is ensured.

What is claimed is:

1. A cylindrical ultrasonic transducer comprising:
    an acoustic matching layer including at least a layer made up of a hard material;
    a piezoelectric member which is provided with electrodes on both plane portions and which is fixed and disposed on a face of the layer made up of the hard material and positioned to allow the acoustic matching layer to protrude in a longitudinal axial direction as compared with the piezoelectric member; and
    a substrate of which at least one face side is formed with an electroconductive pattern and which is fixed and disposed on the face of the layer made up of a hard material;
    wherein, with such a disposed state, the piezoelectric member and the substrate are divided into substrates on which a plurality of piezoelectric devices and a predetermined electroconductive pattern are disposed to array the plurality of piezoelectric devices;
    and wherein the electroconductive pattern of the substrate, and at least part of the electrodes of the piezoelectric member which is electrically connected to at least part of this electroconductive pattern are directed in the same direction, this substrate is disposed adjacent to the piezoelectric member, and the electroconductive pattern on the substrate and the electrodes of the piezoelectric member, which are divided, are electrically connected via an electroconductive member respectively.

2. An ultrasonic transducer according to claim 1, wherein the electroconductive member is an electroconductive film member provided by means of any one or a combination of brazing metal or solder, ultrasonic bonding, an electroconductive member to be connected and fixed using an adhesive agent, an electroconductive adhesive agent, electroconductive painting, sintering, sputtering, ion plating, CVD, and vapor deposition.

3. An ultrasonic transducer according to claim 2, wherein the electroconductive film member is a thick film.

4. An ultrasonic transducer according to claim 2, wherein the electroconductive film member is a thin film.

5. An ultrasonic transducer comprising:
    a ground electrode which is provided on at least an acoustic matching layer made up of a hard material;
    a first layered member which is formed by fixing a predetermined shaped piezoelectric member having electrodes to the acoustic matching layer made up of the hard material;
    a second layered member which is formed by fixing a predetermined shaped substrate having a plurality of electroconductive patterns formed in a predetermined interval on the acoustic matching layer made up of the hard material, said second layered member being fixed adjacent to the piezoelectric member,
    an electroconductive member which electrically connects the electrodes of the piezoelectric member and the electroconductive patterns of the substrate in an integral manner; and
    dividing grooves having a predetermined interval and a predetermined depth dimension which are formed on the piezoelectric member and the substrate which are electrically connected via the electroconductive member.

6. An ultrasonic transducer according to claim 5, wherein the thickness dimension of the piezoelectric member and the thickness dimension of the substrate are set to be generally the same.

7. An ultrasonic transducer according to claim 5, wherein the electroconductive member is a film member.

8. An ultrasonic transducer according to claim 7, wherein the film member is a thick film.

9. An ultrasonic transducer according to claim 7, wherein the film member is a thin film.

10. A method for manufacturing an ultrasonic transducer comprising:
    a process for providing a ground electrode on at least an acoustic matching layer made up of a hard material;
    a process for forming a first layered member by fixing a predetermined shaped piezoelectric member having electrodes to the acoustic matching layer formed of the hard material;
    a process for forming a second layered member by fixing a predetermined shaped substrate having a plurality of electroconductive patterns formed in a predetermined interval on the acoustic matching layer made up of the hard material, said second layered member being fixed adjacent to the piezoelectric member;

a process for providing an electroconductive member for electrically connecting the electrodes of the piezoelectric member and the electroconductive patterns of the substrate in an integral manner; and a process for forming dividing grooves having a predetermined interval and a predetermined depth dimension which are formed on the piezoelectric member and the substrate which are electrically connected via the electroconductive member.

11. A method for manufacturing an ultrasonic transducer according to claim 10, wherein the thickness dimension of the piezoelectric member and the thickness dimension of the substrate are set to be generally the same.

12. A method for manufacturing an ultrasonic transducer according to claim 10, wherein the electroconductive member is a film member.

13. A method for manufacturing an ultrasonic transducer according to claim 12, wherein the film member is a thick film.

14. A method for manufacturing an ultrasonic transducer according to claim 12, wherein the film member is a thin film.

* * * * *